(12) United States Patent
Schulz

(10) Patent No.: US 7,667,842 B2
(45) Date of Patent: Feb. 23, 2010

(54) STRUCTURE AND METHOD FOR SIMULTANEOUSLY DETERMINING AN OVERLAY ACCURACY AND PATTERN PLACEMENT ERROR

(75) Inventor: Bernd Schulz, Radebeul (DE)

(73) Assignee: GlobalFoundries, Inc., Grand Cayman (KY)

( * ) Notice: Subject to any disclaimer, the term of this patent is extended or adjusted under 35 U.S.C. 154(b) by 268 days.

(21) Appl. No.: 11/421,099

(22) Filed: May 31, 2006

(65) Prior Publication Data

US 2007/0076205 A1      Apr. 5, 2007

(30) Foreign Application Priority Data

Sep. 30, 2005     (DE) ................ 10 2005 046 973

(51) Int. Cl.
*G01B 11/00* (2006.01)

(52) U.S. Cl. ................................................ 356/401

(58) Field of Classification Search .......... 356/399–401
See application file for complete search history.

(56) References Cited

U.S. PATENT DOCUMENTS

| | | | | |
|---|---|---|---|---|
| 5,962,173 | A * | 10/1999 | Leroux et al. ............ | 430/5 |
| 6,486,954 | B1 | 11/2002 | Mieher et al. ............ | 356/401 |
| 6,819,426 | B2 * | 11/2004 | Sezginer et al. ......... | 356/401 |
| 7,175,945 | B2 * | 2/2007 | Mieher et al. ............ | 430/5 |
| 7,230,705 | B1 * | 6/2007 | Yang et al. .............. | 356/401 |
| 7,277,185 | B2 * | 10/2007 | Monshouwer et al. ..... | 356/508 |
| 7,301,634 | B2 * | 11/2007 | Mieher et al. ............ | 356/401 |
| 2003/0026471 | A1 | 2/2003 | Adel et al. .............. | 382/144 |
| 2003/0223630 | A1 * | 12/2003 | Adel et al. .............. | 382/145 |
| 2004/0114143 | A1 * | 6/2004 | Van Haren et al. ...... | 356/401 |
| 2004/0233444 | A1 * | 11/2004 | Mieher et al. ............ | 356/401 |
| 2004/0257571 | A1 | 12/2004 | Mieher et al. ............ | 356/401 |
| 2005/0105092 | A1 * | 5/2005 | Ausschnitt et al. ...... | 356/401 |
| 2005/0157297 | A1 * | 7/2005 | Abdulhalim et al. ..... | 356/401 |
| 2005/0174574 | A1 | 8/2005 | Bareket .................. | 356/400 |
| 2005/0231722 | A1 * | 10/2005 | Ausschnitt et al. ...... | 356/401 |
| 2006/0232777 | A1 * | 10/2006 | Finarov et al. ........... | 356/401 |
| 2007/0076205 | A1 * | 4/2007 | Schulz ................... | 356/401 |

FOREIGN PATENT DOCUMENTS

WO      WO 03/071471 A1      8/2003

OTHER PUBLICATIONS

International Search Report Dated Jan. 25, 2007.

* cited by examiner

*Primary Examiner*—Tarifur R. Chowdhury
*Assistant Examiner*—Isiaka O Akanbi
(74) *Attorney, Agent, or Firm*—Williams, Morgan & Amerson, P.C.

(57) ABSTRACT

The present invention provides a technique for obtaining overlay error and PPE error information from a single measurement structure. This is accomplished by forming periodic sub-structures in at least two different device layers in a single measurement structure, wherein at least one segmented and one non-segmented portion is provided in the two different device layers.

22 Claims, 7 Drawing Sheets

STRUCTURE AND METHOD FOR SIMULTANEOUSLY DETERMINING AN OVERLAY ACCURACY AND PATTERN PLACEMENT ERROR

BACKGROUND OF THE INVENTION

1. Field of the Invention

The present invention relates to the field of fabrication of integrated circuits, and, more particularly, to a method and structures for estimating an overlay accuracy and a pattern placement error (PPE) in forming and patterning stacked material layers used for fabricating microstructural features.

2. Description of the Related Art

The fabrication of microstructures, such as integrated circuits, requires tiny regions of precisely controlled size to be formed in a material layer of an appropriate substrate, such as a silicon substrate, a silicon-on-insulator (SOI) substrate, or other suitable carrier materials. These tiny regions of precisely controlled size are generated by patterning the material layer by performing photolithography, etch, implantation, deposition, oxidation processes and the like, wherein, typically, at least in a certain stage of the patterning process, a mask layer may be formed over the material layer to be treated to define these tiny regions. Generally, a mask layer may consist of or may be formed by means of a layer of photoresist that is patterned by a lithographic process. During the lithographic process, the resist may be spin-coated onto the wafer surface and then selectively exposed to ultraviolet radiation through a corresponding lithography mask, such as a reticle, thereby imaging the reticle pattern into resist layer to form a latent image therein. After developing the photoresist, depending on the type of resist, positive resist or negative resist, the exposed portions or the non-exposed portions are removed to form the required pattern in the layer of photoresist.

Since the dimensions of the patterns in sophisticated integrated circuits are steadily decreasing, the equipment used for patterning device features have to meet very stringent requirements with regard to resolution and overlay accuracy of the involved fabrication processes. In this respect, resolution is considered as a measure for specifying the consistent ability to print minimum size images under conditions of predefined manufacturing variations. One important factor in improving the resolution is represented by the lithographic process, in which patterns contained in the photomask or reticle are optically transferred to the substrate via an optical imaging system. Therefore, great efforts are made to steadily improve optical properties of the lithographic system, such as numerical aperture, depth of focus and wavelength of the light source used.

The quality of the lithographic imagery is extremely important in creating very small feature sizes. Of at least comparable importance, however, is the accuracy with which an image can be positioned on the surface of the substrate. Typically, microstructures, such as integrated circuits, are fabricated by sequentially patterning material layers, wherein features on successive material layers bear a spatial relationship to one another. Each pattern formed in a subsequent material layer has to be aligned to a corresponding pattern formed in the previously patterned material layer within specified registration tolerances. These registration tolerances are caused by, for example, a variation of a photoresist image on the substrate due to non-uniformities in such parameters as resist thickness, baking temperature, exposure dose and time and development conditions. Furthermore, non-uniformities of the etch processes can also lead to variations of the etched features. In addition, there exists an uncertainty in overlaying the image of the pattern of the current material layer to the etched or otherwise defined pattern of the previously formed material layer while photolithographically transferring the image of the photomask onto the substrate. Several factors contribute to the ability of the imaging system to perfectly overlay two layers, such as imperfections within a set of masks, temperature differences at the different times of exposure, and a limited registration capability of the alignment tool. As a result, the dominant criteria for determining the minimum feature size that may finally be obtained are the resolution for creating features in individual substrate layers and the total overlay error to which the above explained factors, in particular the lithographic process, contribute.

Therefore, it is essential to steadily monitor the resolution, i.e., the capability of reliably and reproducibly creating the minimum feature size, also referred to as critical dimension (CD), within a specific material layer and to steadily determine the overlay accuracy of patterns of material layers that have been successively formed and that have to be aligned to each other.

In overlay metrology, typically two independent structures, that is one structure in each layer to be printed, are formed by the specified manufacturing processes and the displacement between the centers of symmetry is determined. Frequently, so-called box-in-box marks are used, which are concentrically patterned in each of the layers by measuring their displacement in units of pixels of a charge coupled device (CCD) onto which the concentric alignment marks are imaged during the measurement process. For ever-decreasing feature sizes of microstructures, however, the detection of a displacement, and thus the quantification of an overlay error between both overlay marks, on the basis of edge finding routines may no longer be adequate. Therefore, recently, so-called advanced imaging metrology (AIM) marks are increasingly used to enhance overlay metrology reliability. AIM marks exhibit a periodic structure, thereby enabling utilization of highly powerful metrology techniques. Hence, increased performance of the overlay metrology may be obtained by using periodic overlay marks. With decreasing feature sizes, however, a discrepancy between overlay characteristics within a single die and the significantly larger structures of the overlay marks, which are typically located in the scribe line of the substrate, may be observed, thereby rendering measurement data obtained from the target in the scribe line less reliable. One reason for this discrepancy resides in the fact that the lithography tool may image fine structures, as are typically found within the die, such as gate electrodes, shallow trench isolation (STI) structures and the like, in a different manner compared to relatively large structures, which are typically used to form overlay marks. This pattern and size dependent phenomenon of a different degree of overlay is called pattern placement error (PPE). Consequently, the pattern placement error has to be quantified in order to correct the results of the overlay measurements obtained from the overlay marks within the scribe line with respect to the contribution to actual microstructural features within the die. The pattern placement error can conveniently be measured by so-called simultaneous AIM overlay marks, as will be described in more detail with reference to FIGS. 1a and 1b.

FIG. 1a schematically shows a top view of an overlay measurement structure 100, which may be formed on a specified substrate portion 101, which is typically located within a scribe line of any appropriate substrate bearing a plurality of dies, within which actual functional microstructural features are formed. The overlay measurement structure 100 may be provided in the form of an AIM mark, that is, the structure 100 may comprise a periodic structure, which may enable the measurement of an overlay error in at least two independent directions. In this example, the structure 100 comprises four outer periodic structures 101o, two of which have lines and spaces oriented along an x-direction, while the remaining two periodic structures 101o have lines and spaces oriented substantially along the y-direction. Similarly, four inner periodic structures 101i are provided, wherein two of the inner periodic structures 101i have lines and spaces oriented in the x-direction and are placed adjacent to the respectively oriented outer structures 101o. Moreover, the remaining two inner structures 101i are oriented along the y-direction and are located adjacent to the corresponding outer structures 101o. Hereby, the outer structures 101o and the inner structures 101i are formed in different layers so that the combined overlay measurement structure 100 contains information on the overlay accuracy of the two layers including the periodic structures 101o and 101i, respectively, with respect to the x- and y-directions.

The structure 100 may be formed according to the following process flow, wherein it may be assumed that the outer periodic structure 101o may be formed first in a corresponding device layer, such as a layer receiving STI trenches. It should be appreciated that the selection of a respective sequence of material layers is arbitrary and the principles of the formation of the structure 100 may correspondingly be applied to any front-end or back-end process sequence involving a photolithography step for patterning a further material layer on top of one or more previous layers. A pattern according to the outer periodic structures 101o may be imaged by photolithography into a corresponding resist layer that is formed above the substrate under consideration and also above the substrate portion 101. Consequently, in any die regions (not shown), a corresponding pattern for, for instance, STI trenches may be defined simultaneously with the outer periodic structures 101o. After the development of the resist layer, a corresponding well-approved sequence of manufacturing steps including anisotropic etch techniques, deposition techniques, chemical mechanical polishing (CMP), and the like may be performed in order to form the corresponding patterns in the die and also the periodic structures 101o. Thereafter, a process sequence may be performed for forming microstructural features on the previously patterned layer, such as gate electrode structures, polysilicon lines and the like. Hence, a plurality of well-established oxidation and deposition processes may be carried out, such as the formation of a thin gate insulation layer and a subsequent deposition of a gate electrode material and the like, followed by a further photolithography process for patterning the structure, thereby simultaneously forming the periodic inner structures 101i in the substrate portion 101. As previously pointed out, the individual lines and spaces of the inner and outer periodic structures 101i, 101o may not be formed in accordance with the same design rules, but may be patterned in accordance with metrology requirements so as to enhance the detection of any offset between the inner and outer periodic structures 101i, 101o. Thus, the pitch of the inner and outer periodic structures 101i, 101o may be significantly larger compared to any critical dimensions of actual device features formed within the die regions. Consequently, an overlay accuracy with respect to the x- and y-directions may be estimated with moderately high precision for the overlay measurement structure 100 itself, but may not allow a precise estimation of the overlay accuracy within actual die regions having formed therein structural features of significantly less critical dimensions compared to dimensions in the overlay measurement structure 100. Therefore, in addition to the overlay structure 100, the so-called simultaneous AIM overlay marks are frequently used, in which at least some of the features of the periodic structures contain a "fine structure" formed in accordance with the respective design rules for actual device features in the die regions.

In determining the overlay accuracy of the two different layers represented by the inner and outer periodic structures 101i, 101o, a metrology tool, such as a tool for obtaining optical data, is aligned with respect to the structure 100 and data are obtained from respective working zones 110i, 110o, which define a respective measurement area in each of the periodic structures 101i, 101o. For example, the position of the lines and spaces within the respective working zone 110i corresponding to an inner periodic structure 101i may be determined and may then be compared with the corresponding position information of lines and spaces determined for the corresponding outer periodic structure 101o. On the basis of this information, the required information with respect to overlay accuracy in the x- and y-direction may be obtained.

FIG. 1b schematically shows a simultaneous AIM overlay measurement structure 150, which may be formed in the substrate portion 101, in addition to the overlay measurement structure 100. The simultaneous overlay measurement structure 150 may comprise inner periodic structures 151i and outer periodic structures 151o, wherein one of the inner and outer periodic structures 151i, 151o also include a fine structure, which in the example shown is represented by 152 formed in the outer periodic structures 151o. It should be appreciated that the inner periodic structures 151i as well as the outer periodic structures 151o are formed within the same material layer, for instance in the STI layer, as previously explained. Regarding the formation of the simultaneous overlay measurement structure 150, the same criteria apply as previously explained with reference to the structure 100, except for using a different lithography mask to provide the fine structure 152 in one of the inner and outer periodic structures 151i, 151o. Moreover, an amount of offset between the inner and outer periodic structures 151i, 151o is to be set to a predefined value, preferably zero, by design, thereby enabling the determination of any shift of the fine structure 152, which may also be referred to as a segmented structure, with respect to the periodic structures 151i without fine structure, that is, the non-segmented periodic structure 151i.

As previously explained, due to the pattern placement error, a corresponding shift may be detected in the form of an apparent overlay error, and this measure may be used for assessing the contribution of the pattern placement error within a die region to obtain a measure for correcting the actual overlay error between two different device layers measured by the overlay measurement structure 100, as shown in FIG. 1a. Thus, during the measurement of sophisticated microstructural devices, at least two overlay measurement structures, such as the structure 100 and 150, have to be provided, wherein, in highly sophisticated applications, even one simultaneous overlay measurement structure 150 is provided for each of the layers of which the overlay accuracy must be determined. Thus, three overlay measurement structures, that is, one for overlay, i.e., the structure 100, and two for the PPE characterization of two different lithography layers, i.e., the structure 150, may be provided. FIG. 1c schematically illustrates this situation. Here, the three overlay structures 100, 150 and 150 are provided, wherein each of the two structures 150 is formed in a different layer.

Due to the ever-increasing demand on enhanced productivity and reduced manufacturing costs, the dimensions of scribe lines may also be reduced, thereby significantly restricting the available space for any measurement areas within the scribe lines.

In view of this situation, there exists a need for an enhanced technique for determining overlay errors, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the evaluation of positional errors during the formation of microstructural features, such as integrated circuits and the like, wherein the amount of space required for providing a corresponding measurement structure may be reduced compared to conventional techniques, while at the same time, in some illustrative embodiments, the amount of position information obtained during a single measurement event may be increased. For this purpose, a stacked measurement structure is provided that includes periodic portions enabling obtaining information about inner-layer positioning errors and inter-layer positioning errors within a predefined measurement site that may be accessed during a single measurement cycle.

According to one illustrative embodiment of the present invention, an overlay measurement structure comprises a first periodic structure formed in a first device layer of a specified measurement site formed on a substrate, wherein the first periodic structure comprises a first periodic sub-structure and a second periodic sub-structure. The first and second periodic sub-structures each include a plurality of first structure elements of which some comprise a first segmented portion. Moreover, the overlay measurement structure comprises a second periodic structure formed in a second device layer located above the first device layer, wherein the second periodic structure comprises a first periodic sub-structure and a second periodic sub-structure including a plurality of second structure elements, some of which comprise a second segmented portion. Moreover, the first and second periodic structures form a periodic stacked structure in the specified measurement site.

According to another illustrative embodiment of the present invention, a method comprises forming a stacked periodic measurement structure in a predefined measurement site of a substrate that is usable for the fabrication of semiconductor devices, wherein the stacked periodic structure comprises a first segmented portion and a first non-segmented portion formed in a first layer, and a second segmented portion and a second non-segmented portion formed in a second layer. The method further comprises obtaining position information from each of the first and second segmented and non-segmented portions and determining an overlay accuracy of structural features formed above the substrate outside of the predefined measurement site.

According to yet another illustrative embodiment of the present invention, a method comprises forming a stacked periodic measurement structure in a predefined measurement site of a substrate that is usable for the fabrication of semiconductor devices. The stacked periodic structure comprises a first segmented portion and a first non-segmented portion formed in a first layer and comprises a second segmented portion and a second non-segmented portion formed in a second layer. One of the segmented and non-segmented portions of the first or second layers is positioned in a first exposure field and the other portion is positioned in a second exposure field overlapping with the first exposure field during an exposure process for forming the stacked periodic measurement structure. Moreover, the method comprises obtaining position information from each of the first and second segmented and non-segmented portions and evaluating one of a grid distortion and overlay accuracy on the basis of the position information.

BRIEF DESCRIPTION OF THE DRAWINGS

The invention may be understood by reference to the following description taken in conjunction with the accompanying drawings, in which like reference numerals identify like elements, and in which:

FIG. 2b schematically shows an enlarged view of a single measurement structure similar to the structure as shown in FIG. 2a;

Figure 1A:
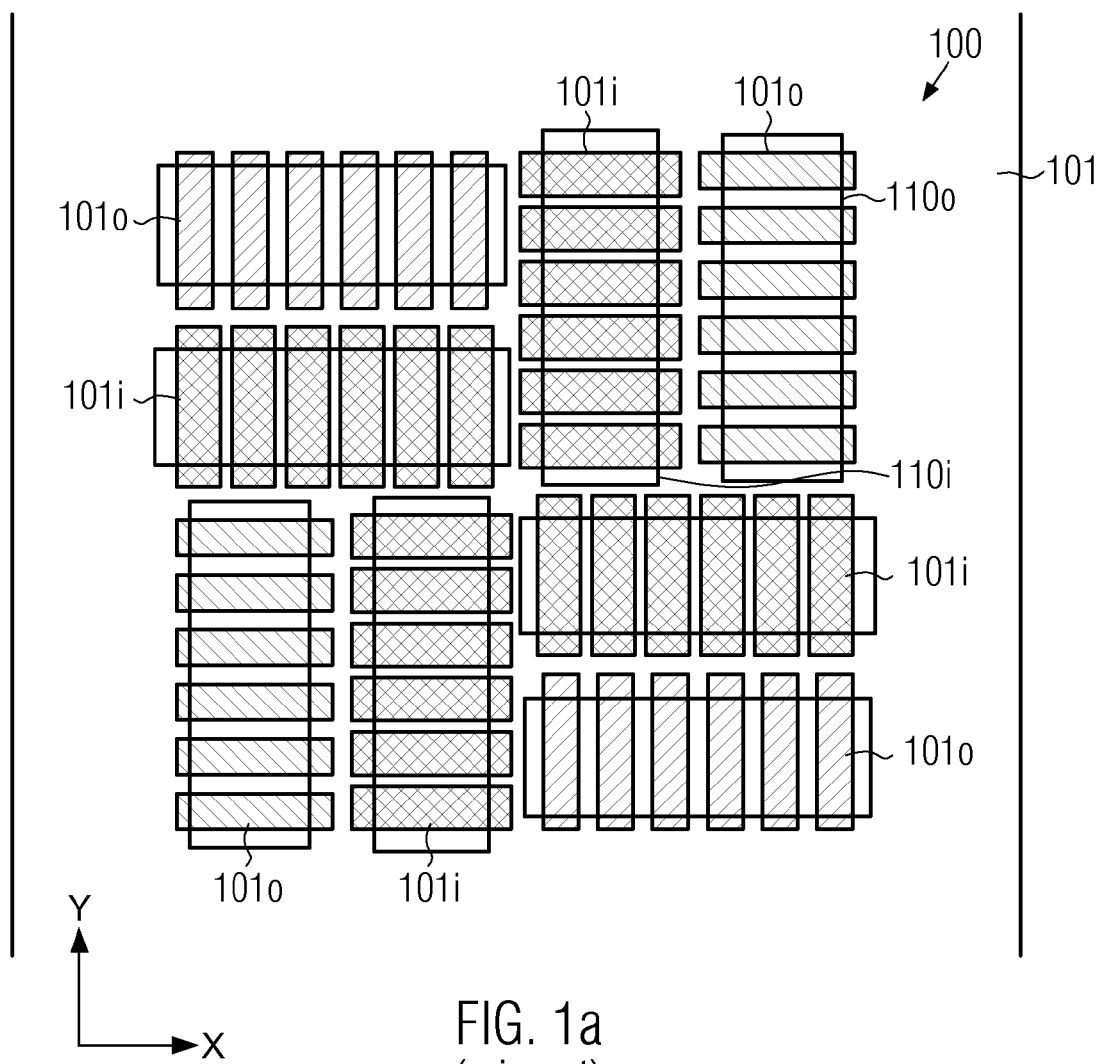
FIG. 1a schematically shows a top view of a prior art overlay structure including non-segmented periodic sub-structures, each of which is formed in a respective device layer.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention provides an improved measurement structure with increased functionality. The improved measurement structure may provide information on overlay accuracy and/or pattern placement error and/or grid distortion and the like in a time-efficient manner, and, in some embodiments, in a substantially simultaneous manner. The improved measurement structure may also consume less space on a substrate. For this purpose, a new configuration for a measurement structure is provided, in which at least two periodic patterns are formed in each device layer to be monitored with respect to position errors, wherein an overall stacked configuration is obtained that does not unduly waste precious substrate space such that, from the corresponding measurement structure, information on inner-layer position errors as well as inter-layer position errors may be extracted in a single measurement cycle. Hereby, the term "stacked" is to be understood in relation to the measurement site, that is, within the measurement site a stacked structure may include a configuration in which two sub-structures are located above each other and may also be laterally offset to each other. This may be accomplished in that in each layer a corresponding structure portion is provided that is formed by relatively large structure elements, which may also be referred to as non-segmented structure elements, while the other portion in the same layer is formed of structure elements exhibiting a "fine structure," and thus these structure elements may also be referred to as segmented structure elements.

As previously explained, the patterning process for forming microstructural features in two or more subsequent device layers may significantly depend on pattern density, feature size and the like, so that a significant discrepancy may be provided in producing corresponding measurement results when relatively large structural elements in specified measurement sites outside of an actual device region are evaluated with respect to position errors of features within the actual device region. Contrary to conventional approaches, in which one or more measurement structures are provided for determining an inner-layer position error within each single device layer, thereby consuming a significant amount of substrate space, by using the multifunctional measurement structure of the present invention, a significantly increased amount of information may be extracted per unit area. Additionally, the measurement procedure described herein may be enhanced so that an increased amount of information may be obtained substantially simultaneously. Moreover, according to the inventive configuration of the measurement structure disclosed herein, a further enhancement may be obtained by using the structure to obtain measurement data by cross-sectional analysis and/or to determine other lithography specific positioning errors, such as grid distortion and the like. With reference to FIGS. 2a-2e, further illustrative embodiments of the present invention will now be described in more detail.

Figure 1B:
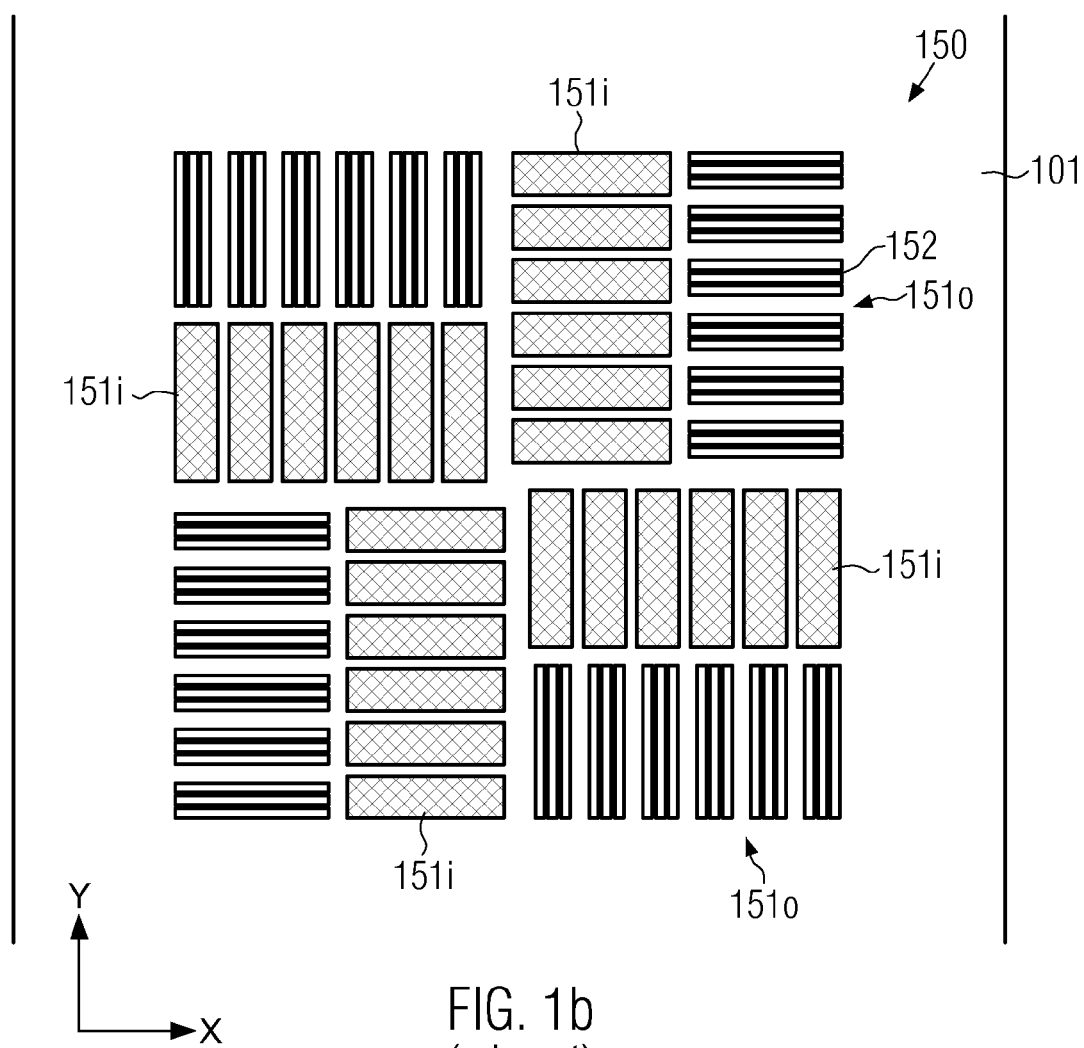
FIG. 1b schematically shows a top view of a prior art simultaneous overlay measurement structure including segmented and non-segmented sub-structures formed in a single device layer.
Figure 1C:
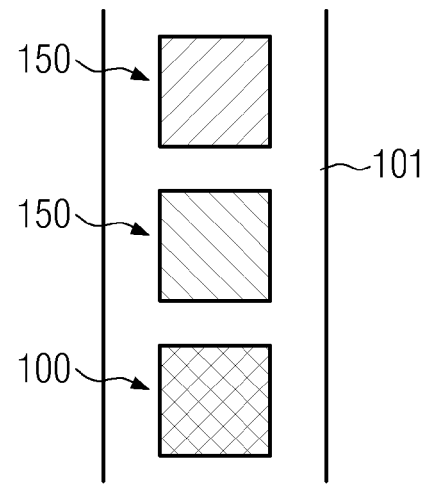
FIG. 1c schematically illustrates a top view of a scribe line including prior art measurement structures for determining a PPE and an overlay accuracy for two different device layers.
Figure 2A:
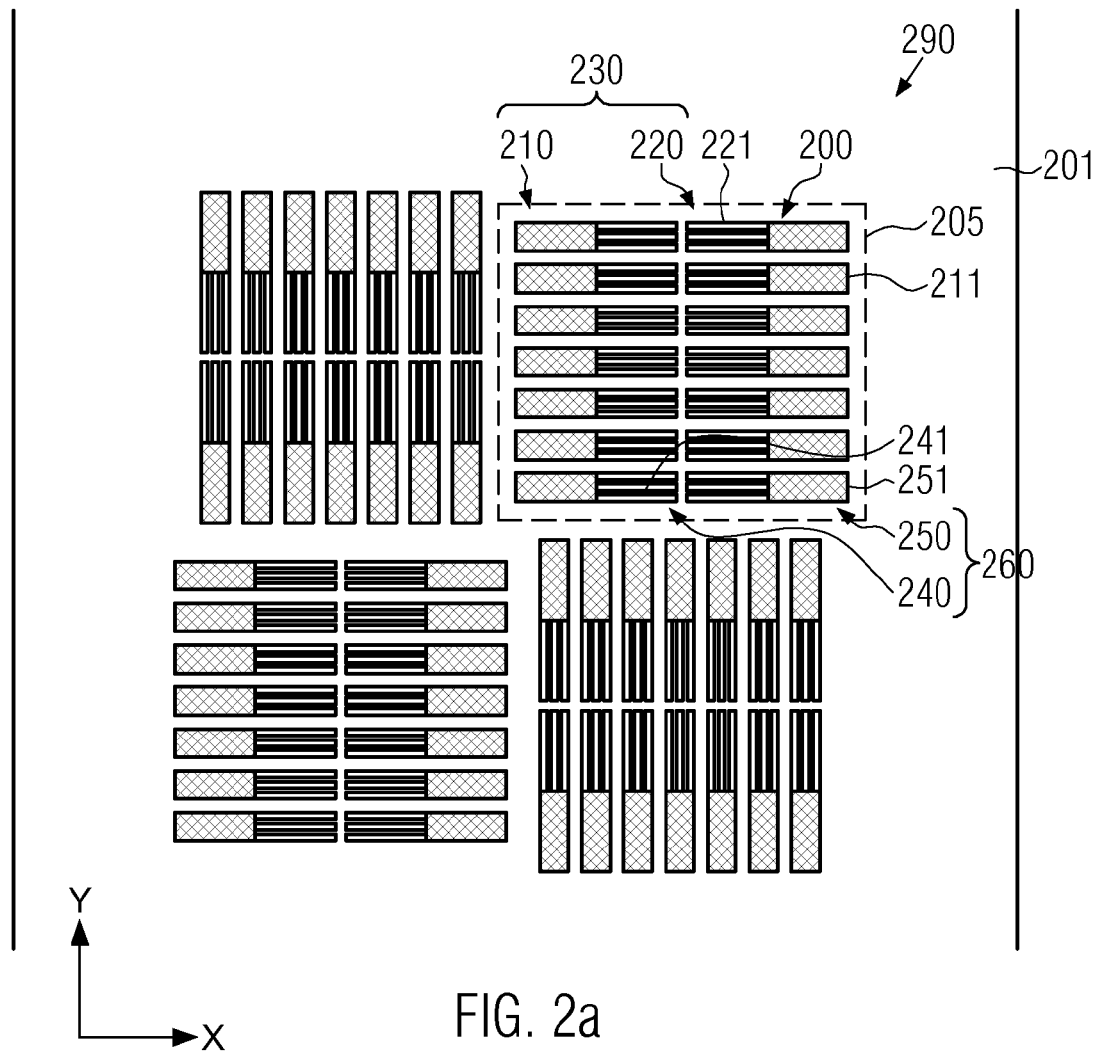
FIG. 2a schematically shows a top view of a measurement structure including segmented and non-segmented sub-structures in a stacked configuration for simultaneously obtaining inner-layer and inter-layer position information according to one illustrative embodiment.

FIG. 2a schematically shows a top view of a device 290, which may represent a semiconductor device, a micromechanical device, a micro-optical device, or any combination thereof, which is formed on the basis of micromechanical and microelectronic processes. The device 290 comprises an appropriate substrate, from which a specified portion 201 may represent a substrate position that is available for defining therein measurement sites to provide the possibility of obtaining information during the manufacturing process of the device 290. For example, the portion 201 may represent a scribe line of a semiconductor device, including a plurality of die regions (not shown), in which specified microstructural features have been formed. A measurement site 205 may be defined within the portion 201, wherein the measurement site 205 may not be bordered by any physical boundaries but may be defined functionally by positioning therein a measurement structure 200, which may be accessed by a specified measurement procedure in a single sampling process. For example, the measurement site 205 may be defined substantially by the dimensions of the measurement structure 200, which in turn are selected so as to be detectable and measurable by a single alignment procedure performed by any appropriate measurement tool. For instance, the various measurement structures 100, 150 in FIG. 1c typically define three different measurement sites, since a measurement procedure for obtaining data from each of the measurement structures may require at least one alignment procedure and subsequent data acquisition run for each of the measurement structures.

The measurement structure 200 may comprise, in one illustrative embodiment, a first periodic structure 230 formed in a first device layer and a second periodic structure 260 formed in a second device layer. The first periodic structure 230 may in turn comprise a first periodic sub-structure or portion 210 and a second periodic sub-structure or portion 220. Similarly, the second periodic structure 260 may comprise a first periodic sub-structure or portion 240 and a second periodic sub-structure or portion 250. The first and second sub-structures 210, 220 may be comprised of a plurality of structure elements 211, 221, some of which may be provided in the form of substantially continuous, i.e., non-segmented elements, while others are provided in the form of segmented elements. In this context, a segmented structure element may be considered as including any pattern that may be defined by a lateral dimension that is less than a minimum lateral dimension of a non-segmented element.

For example, in the embodiment shown, the structure elements 211 may be provided as non-segmented elements, whereas the structure elements 221 may be provided as segmented elements having formed therein a pattern of "lines" and "spaces" wherein the lines and the spaces may be represented by corresponding regions of different characteristics, which may not necessarily include a difference in topology as may be implied by the terms lines and spaces. For convenience, these terms may be used throughout the specification, however, without intending to restrict the present invention to the literal meaning of lines and spaces. Moreover, the term "segmented" may also include any type of patterning within each segmented portion, wherein patterning may refer to any type of geometric configuration involving lateral dimensions that are less than the lateral dimensions of non-segmented elements, such as the elements 211. Thus, the segmented elements 221 may also include vias, line segments and the like as may be considered appropriate for creating a pattern density and a feature size as may also be encountered in actual device regions within the device 290. Therefore, in some illustrative embodiments, the segmented circuit elements 221 may be segmented on the basis of lateral sizes that are comparable to any design feature sizes of the specific device layer, in which the periodic structure 230 is formed. Similarly, the periodic sub-structures 240 and 250 may be comprised of structure elements 241, 251, respectively, some of which may be provided in the form of segmented elements, while others may be provided as non-segmented elements. Regarding the type of "segmentation," as well as any lateral dimensions, the same criteria apply as discussed above. It should be appreciated that in some embodiments the segmented elements 241 may differ from the segmented elements 221 in that the type of segmentation and/or the lateral dimensions of the segmentation may be different. In this case, each type of segmented element 221, 241 may be appropriately adapted to the design rule specifics of the corresponding layer so that inner-layer position information, such as information on the pattern placement error in each individual layer, may be obtained more precisely. Moreover, in some embodiments, the sub-structures 210, 220, 240, 250 may each comprise a combination of segmented and non-segmented structure elements.

Furthermore, the number of structural elements in each of the sub-structures 210, 220, 240, 250 may vary depending on the design and device requirements, wherein advantageously at least three or more structure elements per sub-structure may be provided. Moreover, as shown in some illustrative embodiments, the first and second sub-structures 210, 220 comprising the first periodic structure 230 may be positioned such that the first periodic sub-structure 240 of the second periodic structure 260 is laterally disposed therebetween. In other illustrative embodiments, the first and second sub-structures 210, 220 may be positioned adjacent to each other and similarly the first and second sub-structures 240, 250 may be located adjacent to each other. The measurement structure 200 is designed to provide inner-layer position information and inter-layer position information with respect to at least one predefined direction, which, in the embodiment shown, may be the y-direction. In this respect, an inner-layer position information may be considered as any displacement of the first and second sub-structures 210, 220, or portions thereof, with respect to each other while an inter-layer position information may be considered as any information describing a relative displacement of one or more of the first and second sub-structures 210, 220, or portions thereof, with respect to one or more of the sub-structures 240, 250, or portions thereof. For example, the relative displacement between the periodic sub-structure 210 and the periodic sub-structure 250 may be considered as an overlay error between the respective device layers corresponding to the overlay error as measured in the conventional measurement structure 100 described with reference to FIG. 1a. An example for an inner-layer position information may be a relative displacement, for instance described by the pattern placement error, between the sub-structure 210 and 220, which corresponds to the inner-layer positioning error obtained by the simultaneous overlay measurement structure 150 described with reference to FIG. 1b. Moreover, as is shown in FIG. 2a, a plurality of measurement structures 200 may be provided so as to provide an enhanced measurement accuracy and also provide the possibility of determining position information with respect to at least one further predefined direction, such as the x-direction.

Figure 2B:
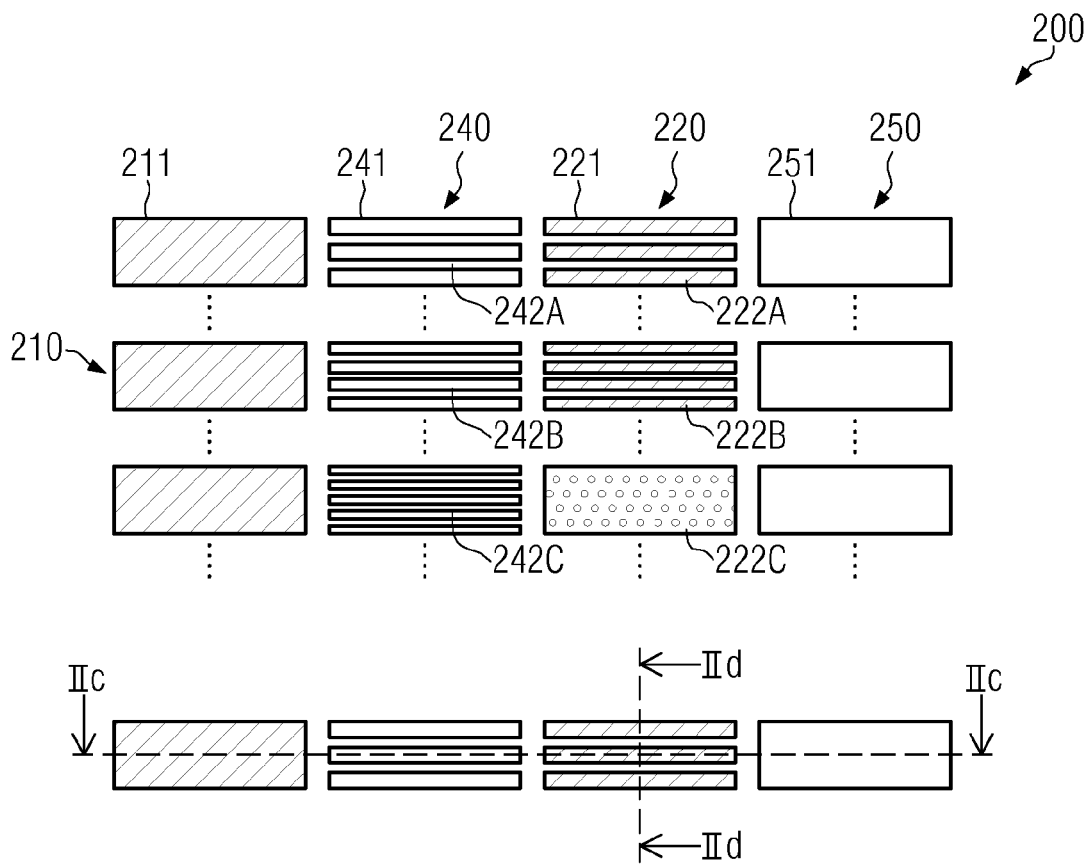

FIG. 2b schematically shows the measurement structure 200 in an enlarged view according to further illustrative embodiments of the present invention. In some embodiments, the segmented elements 241 and 221 may be selected differently. A plurality of exemplary segmentations 242a, 242b, 242c, 222a, 222b, 222c is illustrated and should not be considered as limitations of the present invention unless otherwise stated in the claims. For instance, one of the segmentations 242a, 242b, 242c may be used in the sub-structure 240 and one of the segmentations 222a, 222b, 222c may be used for the sub-structure 220. As previously stated, segmented structure elements, such as the elements 221 or 241, having one or more segmentations 222a, 222b, 222c, 242a, 242b, 242c may also be provided in one or both of the sub-structures 210 and 250. It should further be appreciated that the size and shape of the structure elements 211, 241, 221, 251 may be selected in any appropriate manner as long as the predefined periodicity, that is, a substantial identical repetition of a plurality of structure elements along one predetermined direction, is obtained. That is, the size and shape of the individual structure elements 211, 241, 221, 251 may be rectangular (as shown), squared, T-shaped, L-shaped and the like, wherein the overall dimensions may be selected so as to obtain the required position information, preferably by optical detection techniques, such as microscopy and the like. On the other hand, the segmentation or fine structure of the elements 241, 221 may be selected in accordance with design rules of actual device features in order to provide meaningful information on the influence of the pattern density and/or feature size on the overlay accuracy. In some embodiments, as will be explained later on, some of the structure elements of an underlying layer, such as the elements 211 or 241 in FIG. 2b, may be, at least partially, "overwritten" by some of the structural elements 241 or 251, which may enable a precise analysis by cross-sectional analysis, for instance by electron microscopy, x-ray microscopy and the like, when an overwritten portion is prepared as a cross-sectional sample.

Figure 2C:
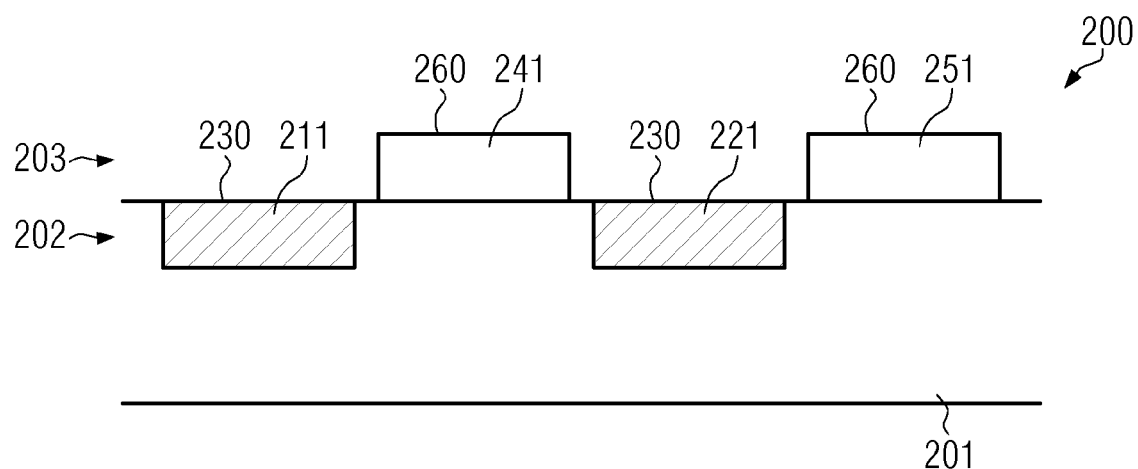
FIGS. 2c and 2d schematically show a cross-sectional view taken along the lines IIc-IIc and IId-IId of FIG. 2b.

FIG. 2c schematically shows a cross-sectional view of the measurement structure 200 of FIG. 2b according to the section IIc shown in FIG. 2a. A first device layer 202 is formed above the substrate portion 201 and may include the first periodic structure 230, i.e., the structure elements 211 and 221, for instance in the form of trenches filled with a specific material, such as silicon dioxide, silicon nitride and the like, if the first device layer 202 represents a shallow trench isolation (STI) layer of a silicon based integrated circuit. In other examples, the first device layer 202 may represent a metallization layer, in which the structure elements 211, 221 may represent metal-filled lines or other regions. Above the first device layer 202 is formed a second device layer 203, which may include the second periodic structure 260, i.e., the structure elements 241 and 251. In the former example of an STI layer, the structure elements 241, 251 may be formed for instance of a resist pattern formed above a gate electrode material layer, a patterned layer stack including polysilicon and the like. For example, in sophisticated integrated circuits, critical dimensions, i.e., dimensions in the STI layer receiving gate electrodes, may be 50 nm or even less, so that overlay accuracy may significantly depend on the feature sizes due to increased pattern placement errors. Consequently, in sophisticated applications, the structure elements 241 and/or 221 may include a segmentation (not shown in the cross-sectional view of FIG. 2c) involving dimensions comparable to the critical dimensions encountered in the respective device layers 202, 203.

Figure 2D:
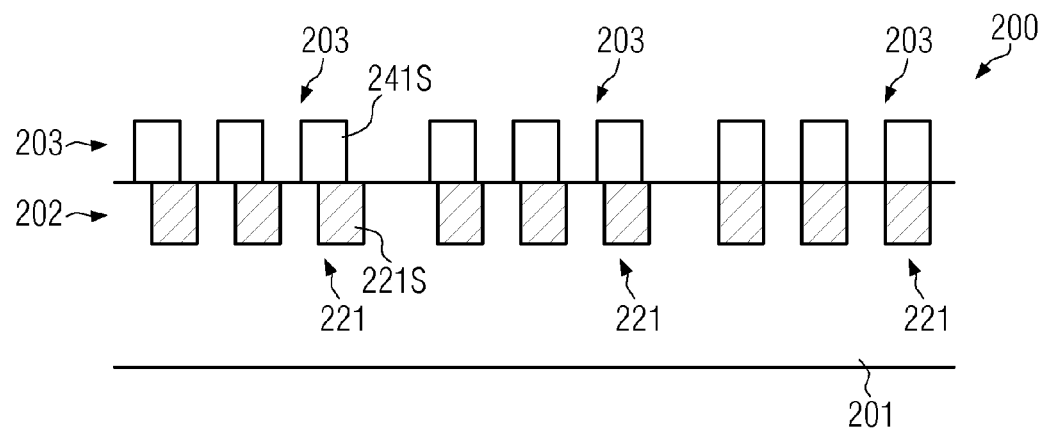

FIG. 2d schematically shows a cross-sectional view according to the section 11d depicted in FIG. 2a. In this example, each of the individual structure elements 221 and 241 may comprise three "sub-elements" 221s and 241s, respectively, which may represent the corresponding segmentation used in the sub-structures 220 and 240 (FIG. 2a).

The measurement structure 200 may be formed in accordance with well-established process techniques used for the fabrication of actual microstructural features, such as circuit elements of integrated circuits. During this well-established process flow, a correspondingly designed photomask is provided including a corresponding pattern for the measurement structure 200 or a plurality thereof, as is for instance shown in FIG. 2a, so as to locate the structure 200 or any number of combinations thereof with appropriately selected different orientations in the predefined substrate portion 201. That is, during a first manufacturing sequence, the first device layer 202 may be formed, for instance by using photolithography, etch techniques, deposition techniques, implantation techniques, planarization techniques and the like, and, thereafter, the second device layer 203 may be formed, wherein a photolithography step is to be performed, thereby aligning the microstructural features and also the features of the measurement structure 200, i.e., the second periodic structure 260 (FIG. 2a) to the first periodic structure 230. Thereafter, the device 290 may be subjected to a measurement procedure as will be described in more detail with reference to FIG. 2e.

Figure 2E:
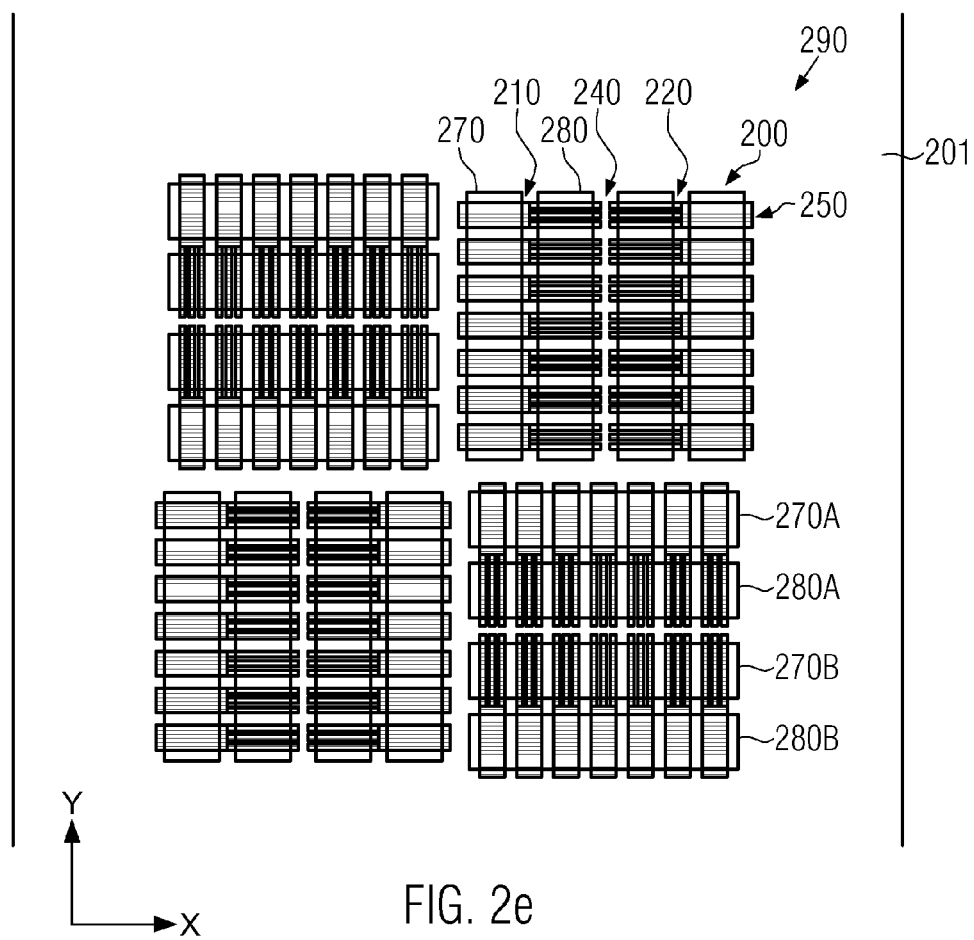
FIGS. 2e and 2f schematically show a top view of a multifunctional measurement structure and appropriate working zones of a measurement device in accordance with further illustrative embodiments.

FIG. 2e schematically shows a top view of the device 290 during a measurement process for obtaining position information from the measurement structure 200. Similar to the measurement procedure on the basis of working zones of a corresponding measurement device, such as a microscope and the like, a first or inner working zone 270 and a second or outer working zone 280 may be defined if a measurement device is used that may provide two working zones only, as is typically the case in prior art techniques. The capability of the measurement device may be taken into consideration when designing the measurement structure 200 so that an overlap of the inner and outer working zones 270, 280 during measurement may be effectively suppressed and the corresponding working zones may be placed so as to obtain position information from the respective two periodic sub-structures only. With a corresponding adjustment of the measurement device and/or appropriate design of the individual sub-structures 210, 240, 220, 250, the first and second working zones 270, 280 may be commonly placed sequentially on the respective two of the periodic sub-structures to thereby obtain position information indicating the relative positioning of the corresponding sub-structures.

Consequently, the following measurements may sequentially be performed: (1) the working zone 270 above sub-structure 210 and the working zone 280 above the sub-structure 240—resulting in inner-layer position information, for instance PPE, of the first device layer 202; (2) the working zone 270 above the sub-structure 240 and the working zone 280 above the sub-structure 250—resulting in an inner-layer position information of the second device layer 203, such as PPE; (3) the working zone 270 above the sub-structure 210 and the working zone 280 above the sub-structure 250—resulting in an inter-layer position information, that is, overlay information between non-segmented sub-structures; (4) the working zone 270 above the sub-structure 240 and the working zone 280 above the sub-structure 220—resulting in an inter-layer position information, that is, overlay information with respect to segmented sub-structures; (5) the working zone 270 above the sub-structure 210 and the working zone 280 above the sub-structure 240—resulting in an inter-layer position information of the type non-segmented versus segmented; and (6) the working zone 270 above the sub-structure 220 and the working zone 280 above the sub-structure 250—resulting in an inter-layer position information of the type segmented versus non-segmented.

Consequently, inner-layer and inter-layer position information may be obtained by the structure 200, wherein, depending on process strategy, all of the information obtained may be used in assessing the overlay accuracy of the device 290, or only a portion of the information may be obtained and/or evaluated, thereby reducing measurement time.

According to a further illustrative embodiment, the measurement process is adapted to enhance data acquisition. To this end, the working zones 270, 280 may each be divided into two respective sub-zones, indicated as 270a, 270b for the working zone 270 and 280a, 280b for the working zone 280, as is exemplarily shown for one of the structures 200 in FIG. 2e. In this embodiment, measurement data may be obtained from the sub-structures 210, 220, 240, 250 simultaneously. In this case, the corresponding measurement algorithms for the extraction and calculation of position errors from the corresponding image contents of the working zones 270a, 270b, 280a, 280b may be applied to all possible combinations, or to any desired combinations, in parallel and independently from each other. Consequently, up to six independent measurement data may be obtained simultaneously, similarly to the case above: (1) working sub-zones 270a and 270b—inner-layer information of the first device layer 202; (2) working sub-zones 280a and 280b—inner-layer information of the second device layer 203; (3) working sub-zones 270a and 280a—overlay error information of the type non-segmented-segmented; (4) working sub-zones 270b and 280b—overlay error information of the type segmented-non-segmented; (5) working sub-zones 270a and 280b—overlay error information of the type non-segmented-non-segmented; and (6) working sub-zones 280a and 270b—overlay error information of the type segmented-segmented.

Depending on requirements, the corresponding measurement data may be obtained and may be assessed and combined in any way so as to evaluate the overlay accuracy. Consequently, an increased amount of information may be extracted from the measurement structure 200 compared to the conventional technique as is shown in FIG. 1c, since there only inner-layer information of the first and the second device layers as well as inner-layer error information of the type non-segmented-non-segmented may be obtained per each measurement event. Moreover, depending on the size of the measurement structure 200, an increased amount of information may be obtained from a significantly reduced floor space of the device 290 compared to a conventional technique. It should be appreciated that the size of the individual structure elements 211, 241, 221 and 251 may be appropriately selected so as to enable a respective definition of working zones 270 and 280 and, if desired, the corresponding sub-zones, which may result in a somewhat enlarged overall area corresponding to a single one of the structures 100, 150 shown in FIG. 1c, while nevertheless a significant reduction in consumed floor space is achieved. In other embodiments, a similar size as for one of the structures 100, 150 may be used for the four structures 200 as shown in FIG. 2a or FIG. 2e.

Figure 2F:
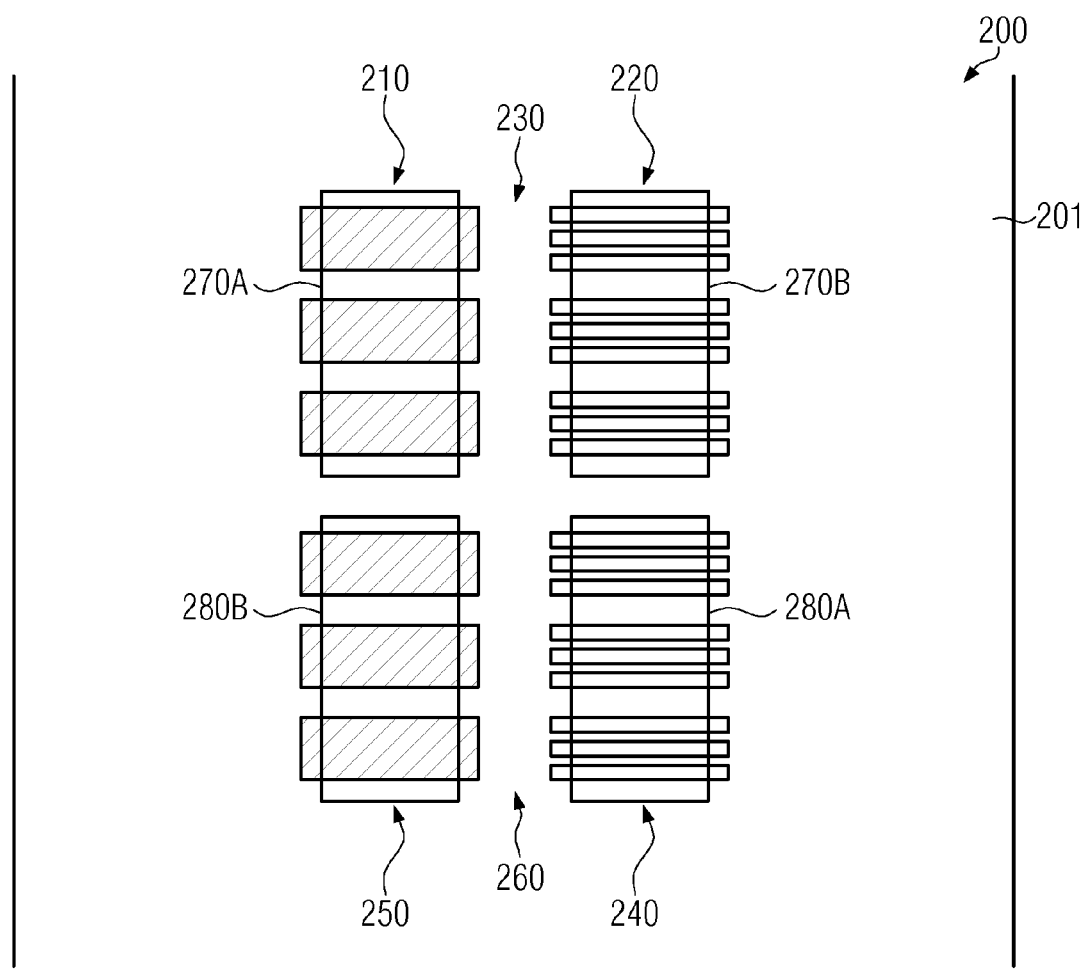

FIG. 2f schematically illustrates the structure 200 according to a further illustrative embodiment, in which the first and second periodic structures 230 and 260 are arranged in a side-by-side configuration without being interleaved. The respective working zones 270 and 280 are correspondingly divided into appropriate sub-zones 270a, 270b and 280a, 280b.

Figure 2G:
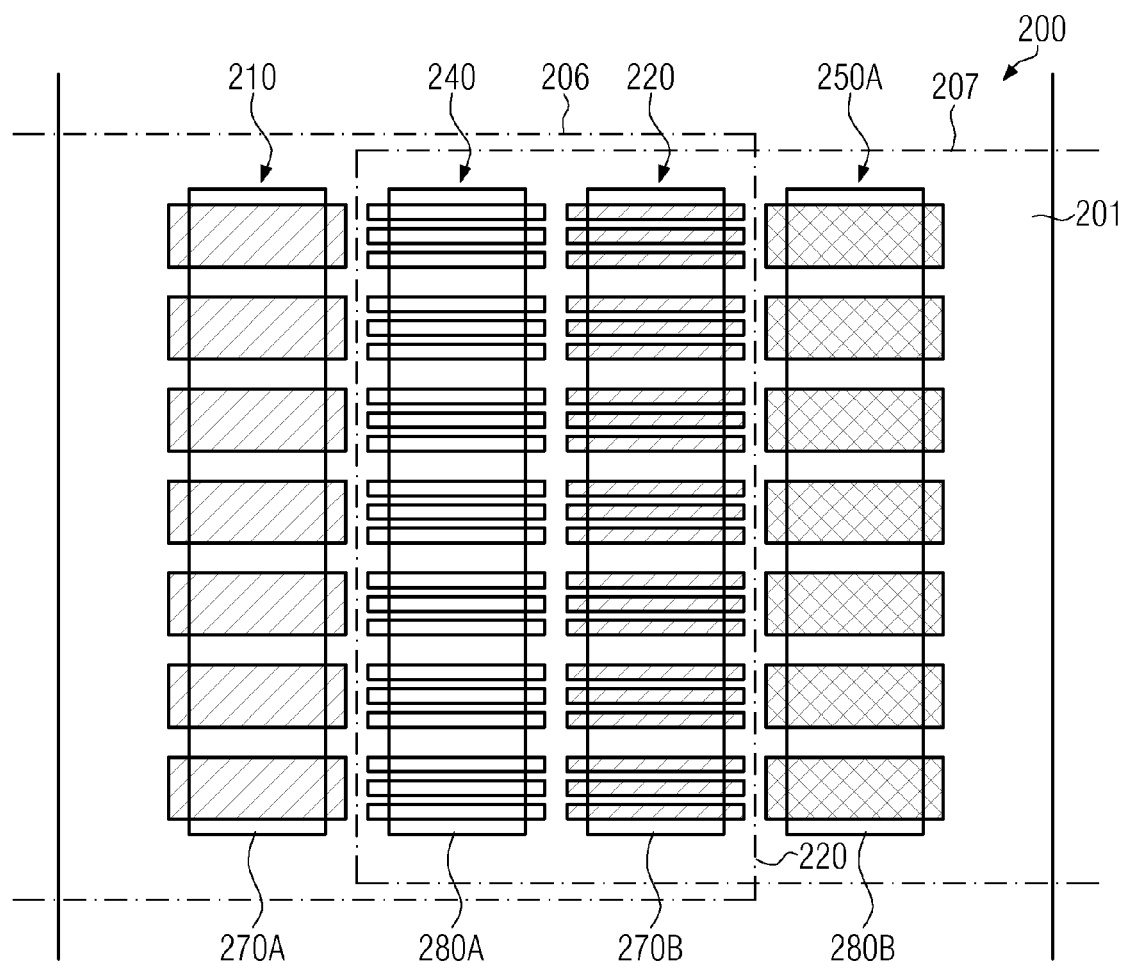
FIG. 2g schematically shows a top view of a measurement structure, in which at least a portion of the structure is used for obtaining additional information, such as positional information on the basis of cross-sectional analysis, information about grid distortion between neighboring exposure fields and the like, according to further illustrative embodiments of the present invention.

FIG. 2g schematically shows the structure 200 according to further illustrative embodiments of the present invention, in which an enhanced functionality of the structure 200 may be obtained. In one embodiment, the structure 200 may be designed such that at least one of the periodic sub-structures is formed in a third device layer. For instance, in the example shown, the sub-structures 210 and 220 may be formed in a first device layer, such as the layer 202, as previously explained, and the sub-structure 240 may be formed in a second device layer, such as the layer 203, as previously discussed, while the sub-structure 250, now referred to as 250a, may be formed in a third device layer, which may be located below or above or between the first and second device layers. Consequently, using the measurement technique involving working sub-zones, i.e., the sub-zones 270a, 270b, 280a, 280b, the following measurement data may be obtained simultaneously from the measurement structure 200: (1) working sub-zones 270a and 270b—inner-layer position information of the first layer; (2) working sub-zones 280a and 280b—overlay information of the second and third layer; (3) working sub-zones 270a and 280a—overlay information of the first and second layer of the type non-segmented-segmented; (4) working sub-zones 270b and 280b—overlay information of the first and third layer of the type segmented-non-segmented; (5) working sub-zones 270a and 280b—overlay information of the first and third layer of the type non-segmented-non-segmented; and (6) working sub-zones 270b and 280a—overlay information of the second and first layer of the type segmented-segmented.

Consequently, an enhanced functionality is obtained which may allow the observation of overlay accuracy with respect to an enhanced "span" while nevertheless requiring a significantly reduced amount of floor space and, if simultaneous measurement techniques are used, with a significantly reduced amount of measurement time. It should be appreciated that there are other combinations with respect to placing one or more of the sub-structures within the third device layer.

In a further illustrative embodiment, the measurement structure 200 may be located within the substrate portion 201 such that two portions or sub-structures, formed in the same device layer, are located in adjacent overlapping exposure fields, indicated as exposure field 206 and 207 in FIG. 2e. That is, the sub-structures 210 and 220, formed in a single device layer, may be formed in the exposure field 206, wherein one of the structures, such as the structure 220, is also positioned within the exposure field 207. In other embodiments (not shown), the measurement structure 200 may be designed such that any overlay area of the exposure field 206 and 207 is located, for instance, between the structures 240 and 220, thereby ensuring that the sub-structure 210 is only formed within the exposure field 206, while the sub-structure 220, formed in the same layer, is formed by the exposure field 207 only. In any case, valuable information, for instance with respect to the grid distortion and the like, may be obtained, wherein this information may be available at the same time, as the measurement technique as described with reference to FIG. 2e on the basis of split sub-zones is used.

In still a further illustrative embodiment, the measurement structure 200 may be designed such that one of the sub-structures, for instance the sub-structure 250a, represents an overlap region of the measurement structure 200, that is, a specific sub-structure (not shown) may be additionally formed in the first layer and may be subsequently "overwritten" by a corresponding sub-structure of the second layer, thereby forming the overlap region 250a. In this case, the same amount of information may be obtained as previously described, while, additionally, position information is "conserved" in the overlap region 250a, which may be extracted at a later stage, for instance by cross-sectional analysis using electron microscopy, x-ray microscopy and the like. To this end, a corresponding section sample may be prepared in the overlap region 250a, for instance by focused ion beam (FIB) techniques. In this way, information having an enhanced degree of accuracy may be obtained due to the high resolution of the involved measurement techniques, thereby providing the possibility of obtaining "calibration" or "reference" data which may be used for scaling or normalizing measurement data received by optical techniques. For example, instead of using a non-segmented overlay portion as indicated in FIG. 2g, for instance, the sub-structure 220 may be overwritten by a corresponding segmented sub-structure, such as the structure 240 formed in the second layer, thereby providing enhanced information with respect to overlay accuracy on the basis of critical dimensions, which may then be used in correspondingly calibrating and evaluating the measurement data obtained by the non-destructive techniques.

As a result, the present invention provides an enhanced technique for obtaining efficient information with reduced measurement time and/or reduced floor space required in scribe line areas of microstructural devices in that a measurement structure includes periodic portions formed in different device layers in such a way that inner-layer information as well as inter-layer information may be obtained from the measurement structure in a single measurement site. Moreover, in some embodiments, the measurement procedure may be adapted such that inner-layer information and inter-layer information may be obtained simultaneously, thereby significantly enhancing the measurement process, while at the same time the accuracy of the interpretation of measurement data may be enhanced. Moreover, enhanced functionality of the measurement structure compared to conventional overlay and PPE structures is achieved, since additional information such as cross-sectional analysis measurement data, grid distortion data and the like may be obtained along with overlay and PPE data.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An overlay measurement structure, comprising:
   a first periodic structure formed in a first device layer of a specified measurement site formed on a substrate, said first periodic structure comprising a first periodic sub-structure and a second periodic sub-structure, the first and second periodic sub-structures in said first periodic structure each including a plurality of first structure elements, wherein a first subset of the first structure elements comprise segmented structure elements, and a second subset of the first structure elements comprise non-segmented structure elements aligned with said segmented structure elements in said first subset of said first structure elements; and a second periodic structure formed in a second device layer located above said first device layer, said second periodic structure comprising a first periodic sub-structure and a second periodic sub-structure, the first and second periodic sub-structures in said second periodic structure each including a plurality of second structure elements, wherein a first subset of the second structure elements comprise segmented structure elements, and a second subset of the second structure elements comprise non-segmented structure elements aligned with said segmented structure elements in said first subset of said second structure elements, said first and second periodic structures forming a periodic stacked structure in said specified measurement site.

2. The overlay measurement structure of claim 1, wherein said first and second periodic structures are oriented to each other so as to provide position information about a relative displacement with respect to at least one predefined direction.

3. The overlay measurement structure of claim 2, wherein said first and second periodic sub-structures of the first periodic structure are oriented to each other so as to provide position information about a relative displacement with respect to said at least one predefined direction.

4. The overlay measurement structure of claim 3, wherein said first and second periodic sub-structures of the second periodic structure are oriented to each other so as to provide position information about a relative displacement with respect to said at least one predefined direction.

5. The overlay measurement structure of claim 4, wherein said first periodic sub-structure of the first periodic structure is located adjacent to said first periodic sub-structure of the second periodic structure.

6. The overlay measurement structure of claim 3, wherein said first periodic sub-structure of the first periodic structure is located adjacent to said first periodic sub-structure of the second periodic structure.

7. The overlay measurement structure of claim 1, wherein each of the first structure elements of the first periodic sub-structure of the first periodic structure comprises a segmented structure element.

8. The overlay measurement structure of claim 7, wherein each of the first structure elements of the second periodic sub-structure of the first periodic structure comprises a non-segmented structure element.

9. The overlay measurement structure of claim 7, wherein each of the second structure elements of the first periodic sub-structure of the second periodic structure comprises a segmented structure element.

10. The overlay measurement structure of claim 9, wherein each of the second structure elements of the second periodic sub-structure of the second periodic structure comprises a non-segmented structure element.

11. The overlay measurement structure of claim 1, further comprising an overlap region, in which a portion of the first periodic structure and the second periodic structure overlap with each other.

12. The overlay measurement structure of claim 1, further comprising a third periodic structure formed in a third device layer located above said substrate to form a layer stack with said first and second device layers, said third periodic structure comprising a plurality of third structure elements and being oriented so as to provide position information about a relative displacement with respect to the first and second periodic structures for at least one predefined direction.

13. A method, comprising:

forming a stacked periodic measurement structure in a predefined measurement site of a substrate usable for fabricating semiconductor devices, said stacked periodic structure comprising a first plurality of segmented elements and a first plurality of non-segmented elements aligned with said first plurality of segmented elements formed in a first layer, and a second plurality of segmented elements and a second plurality of non-segmented elements aligned with said second plurality of segmented elements formed in a second layer;

obtaining position information from each of the first and second pluralities of segmented and non-segmented elements; and determining an overlay accuracy of structural features formed above said substrate outside of said predefined measurement site based upon said obtained position information.

14. The method of claim 13, wherein obtaining position information from each of the first and second pluralities of segmented and non-segmented elements comprises sampling said first and second pluralities of segmented and non-segmented elements with a specified working zone to obtain respective sets of measurement data from within respective working zones.

15. The method of claim 14, wherein determining said overlay accuracy comprises evaluating measurement data obtained from the first plurality of segmented elements and measurement data obtained from the first plurality of non-segmented elements to determine a pattern placement error in said first layer.

16. The method of claim 14, wherein determining said overlay accuracy comprises evaluating measurement data obtained from the second plurality of segmented elements and measurement data obtained from the second plurality of non-segmented elements to determine a pattern placement error in said second layer.

17. The method of claim 14, wherein determining said overlay accuracy comprises evaluating measurement data obtained from at least one of the first plurality of segmented elements and the first plurality of non-segmented elements and measurement data obtained from at least one of the second plurality of segmented elements and the second plurality of non-segmented elements to determine an overlay error between the first layer and the second layer.

18. The method of claim 13, wherein forming said stacked periodic structure comprises forming an overlap region in said measurement site, at least one of the first plurality of segmented elements and the first plurality of non-segmented elements overlapping with at least one of the second plurality of segmented elements and the second plurality of non-segmented elements in said overlap region.

19. The method of claim 18, further comprising obtaining measurement data by at least one of electron microscopy and x-ray microscopy from said overlap region.

20. The method of claim 19, wherein obtaining measurement data by at least one of electron microscopy and x-ray microscopy from said overlap region comprises preparing a cross-sectional sample from said overlap region.

21. The method of claim 19, further comprising using said measurement data obtained by at least one of electron microscopy and x-ray microscopy for evaluating said position information.

22. A method, comprising:

forming a stacked periodic measurement structure in a predefined measurement site of a substrate usable for fabricating semiconductor devices, said stacked periodic structure comprising a first plurality of segmented elements and a first plurality of non-segmented elements formed aligned with said first plurality of segmented elements in a first layer, and a second plurality of segmented elements and a second plurality of non-segmented elements aligned with said second plurality of segmented elements formed in a second layer, one of the first pluralities of segmented and non-segmented elements of one of the first and second layers being positioned in a first exposure field and the other of said first and second pluralities of segmented and non-segmented elements being positioned in a second exposure field overlapping with said first exposure field during exposure;

obtaining position information from each of the first and second pluralities of segmented and non-segmented elements; and evaluating a grid distortion and overlay accuracy on the basis of said position information.

* * * * *